United States Patent

Ma et al.

[11] Patent Number: 6,147,388
[45] Date of Patent: *Nov. 14, 2000

[54] POLYCIDE GATE STRUCTURE WITH INTERMEDIATE BARRIER

[75] Inventors: Yi Ma; Sailesh Mansinh Merchant; Minseok Oh; Pradip Kumar Roy, all of Orlando, Fla.

[73] Assignee: Lucent Technologies, Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/977,318

[22] Filed: Nov. 24, 1997

[51] Int. Cl.[7] .................... H01L 21/283; H01L 21/265

[52] U.S. Cl. .................... 257/412; 257/413; 257/751; 257/764; 438/585; 438/592

[58] Field of Search .................... 257/412, 413, 257/751, 764, 770; 438/585, 592

[56] References Cited

U.S. PATENT DOCUMENTS

| | | | |
|---|---|---|---|
| 4,742,020 | 5/1988 | Roy | 437/61 |
| 5,132,244 | 7/1992 | Roy | 437/13 |
| 5,153,701 | 10/1992 | Roy | 357/54 |
| 5,350,698 | 9/1994 | Huang et al. | 437/26 |
| 5,633,200 | 5/1997 | Hu | 438/653 |
| 5,688,713 | 11/1997 | Linliu et al. | 437/60 |
| 5,846,871 | 12/1998 | Lee et al. | 438/592 |
| 5,874,353 | 2/1999 | Liu et al. | 257/413 |

*Primary Examiner*—Leo P. Picard
*Assistant Examiner*—Hung Van Duong
*Attorney, Agent, or Firm*—Wendy W. Koba, Esq.

[57] ABSTRACT

A CMOS gate structure comprises a multilayered polysilicon structure and a deposited silicide layer, with a nitridized silicide barrier layer formed therebetween. The multilayered polysilicon will exhibit a relatively large grain size and uniform structure. The deposited silicide layer is annealed to mimic the polysilicon grain size and structure. The combination of the tailored grain structure with the intermediate barrier layer results in a gate structure that is essentially impervious to subsequent dopant diffusions.

4 Claims, 1 Drawing Sheet

POLYCIDE GATE STRUCTURE WITH INTERMEDIATE BARRIER

BACKGROUND OF THE INVENTION

1. Field of the Invention

The present invention relates to a polysilicon/silicide ("polycide") gate structure that includes an intermediate nitride layer that acts as a barrier for subsequently applied dopants.

2. Description of the Prior Art

In the production of CMOS integrated circuits, it has become common practice to form the gate structure as a dual-layer polysilicon/silicide ("polycide") arrangement. Tungsten silicide ($WSi_x$) is an exemplary silicide that may be used in this process. Unfortunately, the material mismatch in the dual-layer arrangement results in forming high-angle grain boundaries and other high-diffusivity paths for later-applied dopants, such as boron, resulting in the underlying polysilicon layer becoming boron-doped, an undesired result. One solution to this problem is to include a titanium nitride barrier layer between the polysilicon and the silicide. FIG. 1 illustrates this exemplary arrangement, including a polysilicon layer 10, titanium nitride barrier layer 12 and tungsten silicide layer 14. Titanium nitride barrier layer 12 will retard dopant diffusion (shown illustratively as the downward arrows with the letter "B") at relatively low reaction temperatures (<600° C.). However, above this temperature the titanium nitride integrity deteriorates significantly, causing rapid diffusion of dopants into the polysilicon.

SUMMARY OF THE INVENTION

We have invented an improved polycide gate structure that is essentially impervious to dopants at all potential process temperatures. The structure comprises a first multilayered polysilicon stack, covered by a thin layer of $WSi_x$. The tungsten is annealed in an $NH_3$ atmosphere to "nitridize" the thin layer and form a barrier. The remaining $WSi_x$ is then deposited and annealed to allow for the silicide to mimic the large grain size and structure of the underlying multilayered polysilicon. The increased uniformity in grain size, coupled with the intermediate barrier, provides a structure that is essentially impervious to subsequent dopants.

DETAILED DESCRIPTION

Figure 1:
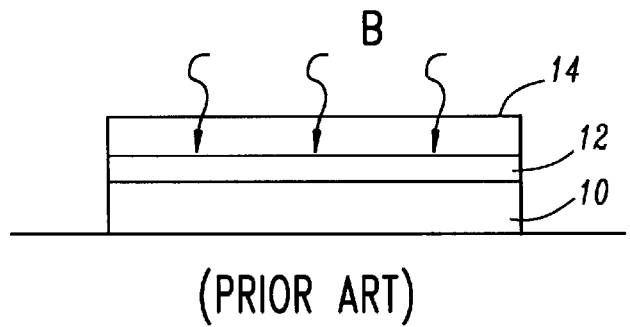
FIG. 1 shows a cross-section of a conventional prior art gate stack structure.
Figure 2:
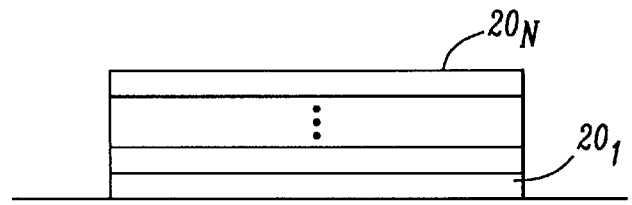
FIGS. 2–4 illustrate the process steps utilized to form the improved gate stack structure of the present invention.

The present detailed description relates to an improved polycide gate stack structure including an intermediate barrier layer. Referring to FIG. 2, the initial step in the gate formation process is to form a multilayer polysilicon structure. Such a layered polysilicon may be formed by deliberately oscillating the polysilicon deposition rate. For example, the deposition temperature may be varied to first form large grain sizes by the pyrolitic decomposition of $SiH_4$, followed by a subsequent anneal at a temperature in excess of 700° C. using a furnace or a rapid thermal anneal (RTA) process. FIG. 2 illustrates a multilayered polysilicon structure 20, including a plurality of sub-layers $20_1$–$20_N$. The total number of polysilicon sub-layers is discretionary, but at least three sub-layers should be formed. U.S. Pat. No. 4,742,020, entitled "Multilayering Process for Stress Accommodation in Deposited Polysilicon" and assigned to the assignee of the present application discloses in detail various methods for forming a polysilicon multilayer structure. Of particular importance with respect to the present invention is that the formation of a multilayer polysilicon results in a polysilicon film with a relatively large grain size.

Figure 3:
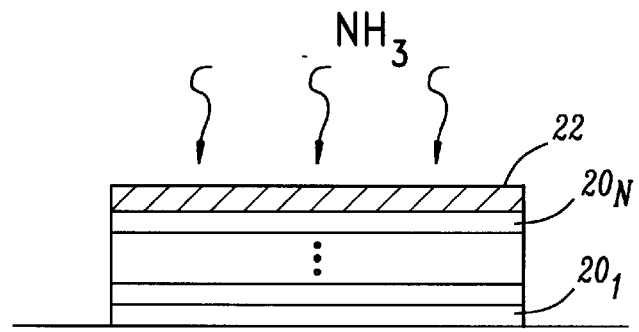
Figure 4:
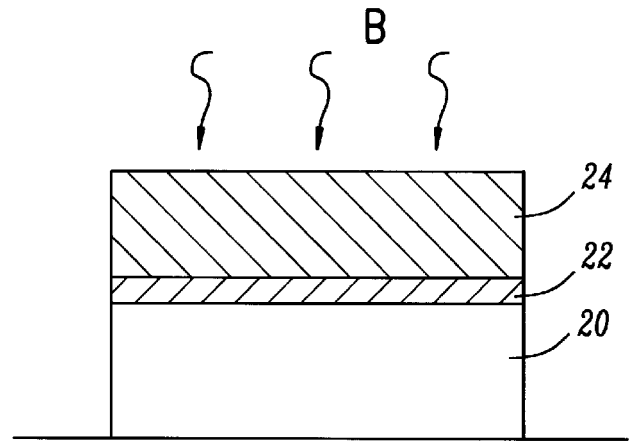

Following the formation of multilayered polysilicon 20, a relatively thin layer 22 of silicide, in this case $WSi_x$, is deposited as shown in FIG. 3. For example, layer 22 may comprise a thickness less than or equal to 50 Å. Thin layer 22 is subsequently annealed in an $NH_3$ atmosphere to "nitridize" layer 22. Thereafter, layer 22 will function as the intermediate dopant barrier layer in the final gate stack structure. A second deposition of the bulk of the silicide then follows, forming silicide layer 24 over barrier layer 22. FIG. 4 illustrates this structure. A final anneal is then performed to allow for silicide layers 22 and 24 to mimic the grain size and structure of polysilicon structure 20.

By virtue of the uniformity in grain size, in association with the intermediate barrier layer, the resultant gate structure is essentially impervious to subsequently applied dopants, regardless of the process temperature. Although the process as described above utilized tungsten silicide in the gate structure, various other silicides, denoted as $MSi_x$, may also be used, where M is any suitable metal, such as titanium, cobalt, tantalum, etc.

What is claimed is:

1. A CMOS gate structure comprising a multilayered polysilicon structure;

a relatively thin nitridized silicide barrier layer formed to cover the multilayered polysilicon structure; and a silicide layer deposited to cover the relatively thin nitridized silicide barrier layer and annealed to exhibit a grain size and structure similar to the multilayered polysilicon structure.

2. A CMOS gate structure as defined in claim 1 wherein the multilayered polysilicon structure includes at least three polysilicon layers formed by varying the polysilicon deposition rate.

3. A CMOS gate structure as defined in claim 1 wherein the relatively thin nitridized silicide barrier layer comprises a thickness less than or equal to 50 Å.

4. A CMOS gate structure as defined in claim 1 wherein the relatively thin nitridized silicide barrier layer and silicide layer comprise tungsten silicide.

* * * * *